(12) United States Patent
Miura et al.

(10) Patent No.: US 8,872,621 B2
(45) Date of Patent: Oct. 28, 2014

(54) CAPACITANCE TYPE DETECTION DEVICE, SENSOR UNIT, AND CONTROL SYSTEM FOR DETECTING APPROACH OF OBJECT, AND METHOD FOR SAME

(75) Inventors: Yoshinori Miura, Tokyo (JP); Hitoshi Moriya, Tokyo (JP); Takanobu Rokuka, Tokyo (JP)

(73) Assignee: Sumida Corporation (JP)

( * ) Notice: Subject to any disclaimer, the term of this patent is extended or adjusted under 35 U.S.C. 154(b) by 212 days.

(21) Appl. No.: 13/404,609

(22) Filed: Feb. 24, 2012

(65) Prior Publication Data
US 2012/0200388 A1 Aug. 9, 2012

Related U.S. Application Data

(63) Continuation of application No. PCT/JP2010/061389, filed on Jul. 5, 2010.

(30) Foreign Application Priority Data

Aug. 31, 2009 (JP) .................................. 2009-199983

(51) Int. Cl.
*B60R 19/00* (2006.01)
*B60R 25/10* (2013.01)
*H03K 17/955* (2006.01)
*E05B 81/78* (2014.01)

(52) U.S. Cl.
CPC .. *H03K 17/955* (2013.01); *H03K 2217/960705* (2013.01); *E05B 81/77* (2013.01); *E05B 81/78* (2013.01)
USPC ..................................... 340/5.72; 340/426.28

(58) Field of Classification Search
USPC ............ 340/5.51, 5.62, 5.72, 426.16, 426.36; 341/33; 382/115, 119
See application file for complete search history.

(56) References Cited

U.S. PATENT DOCUMENTS

| | | | |
|---|---|---|---|
| 8,410,897 B2* | 4/2013 | Popelard | 340/5.2 |
| 2004/0183651 A1* | 9/2004 | Mafune et al. | 340/5.7 |
| 2005/0219043 A1* | 10/2005 | Pollmann et al. | 340/426.28 |
| 2006/0170411 A1* | 8/2006 | Kurachi et al. | 324/132 |
| 2006/0250214 A1* | 11/2006 | Mafune et al. | 340/5.62 |
| 2007/0096905 A1* | 5/2007 | Ieda et al. | 340/562 |
| 2007/0171057 A1* | 7/2007 | Ogino et al. | 340/545.7 |
| 2008/0238135 A1* | 10/2008 | Takeda et al. | 296/146.4 |

FOREIGN PATENT DOCUMENTS

JP 2002-39708 A 2/2002
JP 2009-133777 A 6/2009

OTHER PUBLICATIONS

Office Action for Korean Application 10-2012-7000571, mailed Jun. 22, 2013, with English translation.

* cited by examiner

*Primary Examiner* — Hai Phan
*Assistant Examiner* — Royit Yu
(74) *Attorney, Agent, or Firm* — Cantor Colburn LLP

(57) ABSTRACT

A capacitance type detection device may include a sensor electrode forming a capacitor with respect to a peripheral conductor; a measurement unit measuring the floating capacitance of the sensor electrode, which changes correspondingly to a positional relation between the sensor electrode and the detection object; and a judgment unit judging the approach of the detection object in a case in which there is satisfied an approach detection condition including a fact that a magnitude correlation between a time rate-of-change of the floating capacitance measured by the measurement unit and a predetermined time rate-of-change which is defined correspondingly to a combination of the detection object and an object to be discriminated so as to be different from the detection object lies in a predetermined relation.

6 Claims, 7 Drawing Sheets

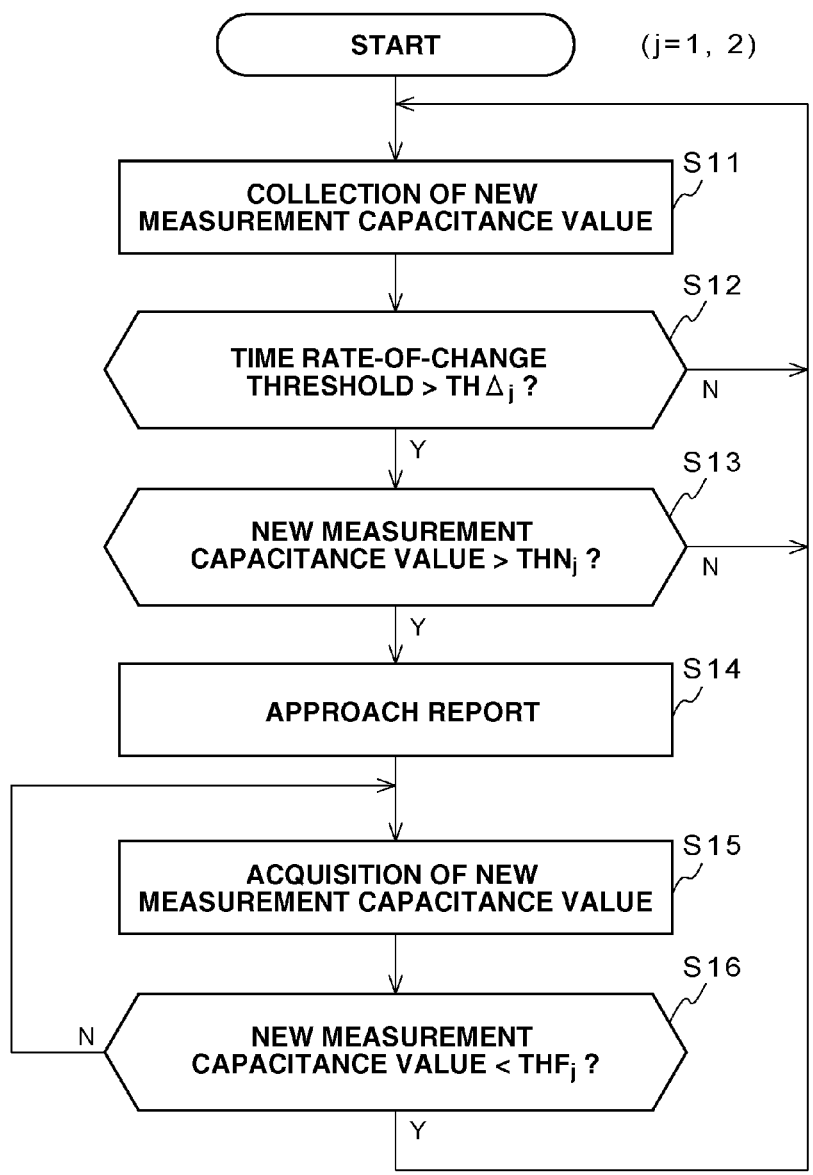

CAPACITANCE TYPE DETECTION DEVICE, SENSOR UNIT, AND CONTROL SYSTEM FOR DETECTING APPROACH OF OBJECT, AND METHOD FOR SAME

The present application is a continuation application of International Application No. PCT/JP2010/061389, filed Jul. 5, 2010, the entire contents of which are incorporated herein by reference and priority to which is hereby claimed. The PCT/JP2010/061389 application claimed the benefit of the date of the earlier filed Japanese Patent Application No. 2009-199983, filed Aug. 31, 2009, the entire contents of which are incorporated herein by reference, and priority to which is hereby claimed.

TECHNICAL FIELD

The present invention relates to a capacitance type detection device and a method for detecting approach of an object and in more detail, relates to a capacitance type detection device and a method thereof for detecting approach of a target object to be detected (hereinafter, referred to as detection object), a sensor unit provided with aforesaid capacitance type detection device, and a control system provided with the sensor unit.

BACKGROUND ART

In recent years, there has been widely used a key-less entry system in which it is possible to carry out locking and unlocking of a door of a vehicle or the like without key operation. In many such key-less entry systems, there is employed a constitution provided with an electrostatic capacitance type touch sensor inside the door handle in order to detect a user's contact with a door handle.

In such an electrostatic capacitance type touch sensor, the floating capacitance of the sensor electrode on the inside is measured. This floating capacitance increases by the user's contact with the door handle. Then, in the electrostatic capacitance type touch sensor, it is constituted such that the user's contact with the door handle is detected in a case in which the measurement value of the floating capacitance of the sensor electrode becomes a predetermined value or more.

However, in the rainy weather, rainwater which is a conductor accumulates in the vicinity of the sensor electrode, so that the floating capacitance of the sensor electrode increases. For this reason, regardless of the fact that the user did not contact the door handle, it sometimes happened that lock or unlock was carried out by an erroneous detection that the user would contact the door handle.

Here, the vicinity of the sensor electrode where rainwater easily accumulates means a boundary portion between the upper surface of the door handle and the door panel. Focusing attention on this fact, there has been proposed a technology in which the contact detection sensitivity of the sensor electrode at a portion near to the door panel is made lower than the contact detection sensitivity of the sensor electrode at a portion far from the door panel (see Patent Document 1: hereinafter, referred to as "conventional example"). In the technology of this conventional example, it is configured such that a constitution is employed in which a notch portion is formed at a portion of the sensor electrode near to the door panel and the housing of the door handle which houses the electrostatic capacitance type touch sensor employs a constitution in which in the vicinity of the sensor electrode, the dielectric constant of a portion far from the door panel exceeds the dielectric constant of a portion near to door panel.

Prior-Art Document

Patent Document

Patent Document 1: Japanese unexamined patent publication No. 2009-133777

DISCLOSURE OF THE INVENTION

Problem to be Solved by the Invention

The technology of the conventional example mentioned above is an excellent technology from such a viewpoint that erroneous detection caused by the increase in the floating capacitance, wherein rainwater which is a conductor accumulates in the vicinity of the sensor electrode and this brings about an increase in the floating capacitance of the sensor electrode, is to be prevented. However, in the technology of the conventional example, it happens that the shape of the sensor electrode becomes complicated and/or the constitution of the housing of the door handle becomes complicated, which causes the productivity of the products to lower. For this reason, a technology is desired in which erroneous detection of a waterdrop or a water current in the rainy weather or at the time of washing of the vehicle is effectively prevented without causing the lowering of the product productivity.

The present invention was invented in view of the situation mentioned above and is addressed to provide a capacitance type detection device and a detection method in which it is possible to detect an approach of the detection object with excellent accuracy by a simple constitution.

Also, the present invention is addressed to provide a sensor unit including aforesaid capacitance type detection device, and a control system including aforesaid sensor unit.

Means for Solving the Problem

When the electroconductive object approaches with respect to the sensor electrode which forms a capacitor together with a peripheral conductor, the floating capacitance of aforesaid sensor electrode increases and the increasing speed thereof changes in accordance with the size or the like of aforesaid electroconductive object. Consequently, the present inventors carried out various experiments and repeated careful considerations wherein by considering the difference in the time rate-of-change of the floating capacitance of the sensor electrode, which corresponds to the difference in size or the like between the electroconductive detection object and the electroconductive object to be discriminated so as to be different from aforesaid detection object (Hereinafter, it sometimes happens that this is referred to as "object other than the detection object"), they obtained such a knowledge that it is possible to distinguish between the approach of the detection object and the approach of the object other than the detection object. The present invention was invented based on such a knowledge.

More specifically, from a first viewpoint, the present invention discloses a capacitance type detection device which detects an approach of an electroconductive detection object characterized by including: a sensor electrode forming a capacitor with respect to a peripheral conductor; a measurement unit measuring the floating capacitance of aforesaid sensor electrode, which changes correspondingly to a positional relation between aforesaid sensor electrode and aforesaid detection object; and a judgment unit judging the approach of aforesaid detection object in a case in which there is satisfied an approach detection condition including a fact that a magnitude correlation between a time rate-of-change of the floating capacitance measured by aforesaid measurement unit and a predetermined time rate-of-change which is defined correspondingly to a combination of aforesaid detection object and an object to be discriminated so as to be different from aforesaid detection object lies in a predetermined relation.

In this capacitance type detection device, the measurement unit measures the floating capacitance of the sensor electrode. In this manner, based on the floating capacitance measured by the measurement unit, the judgment unit calculates the time rate-of-change (for example, average time rate-of-change during the time period of a predetermined time length) of the measured floating capacitance. Subsequently, the judgment unit judges whether or not an approach detection condition is satisfied which includes a fact that a magnitude correlation between a predetermined time rate-of-change defined correspondingly to a combination of the detection object and an object to be discriminated so as to be different from aforesaid detection object and the calculated average time rate-of-change lies in a predetermined relation. When this approach detection condition is satisfied, the judgment unit judges that the detection object has approached.

Therefore, according to a capacitance type detection device of the present invention, it is possible to detect an approach of the detection object with excellent accuracy by a simple constitution.

In a capacitance type detection device of the present invention, it is possible to set aforesaid approach detection condition so as to include a condition that aforesaid measured floating capacitance exceeds a predetermined value defined correspondingly to aforesaid detection object. In this case, in addition to the average time rate-of-change of the floating capacitance of the sensor electrode during the time period of the predetermined time length, the amount of increase in aforesaid floating capacitance is evaluated. Consequently, it is possible to detect an approach of the detection object with greater accuracy.

It should be noted as the "predetermined value" that it is possible to employ such a value as (a) a value lying between an assumption value of the floating capacitance of the sensor electrode in a state in which the detection object does not exist on the periphery of the sensor electrode and an assumption value of the floating capacitance of the sensor electrode in a case in which the detection object has approached the sensor electrode, and (b) a value obtained by multiplying the movement average value of the measurement value of the floating capacitance of the sensor electrode in a state in which the detection object does not exist on the periphery of the sensor electrode by a value of one or more predetermined depending on an experiment, simulation, experience or the like.

From a second viewpoint, the present invention relates to a sensor unit, characterized by including the capacitance type detection device of the present invention, and an antenna carrying out transmission & reception of a radio signal. In this sensor unit, it is possible to detect an approach of the identified detection object by utilizing the capacitance type detection device of the present invention mentioned above which is included as a constituent of aforesaid sensor unit. Also, by utilizing the antenna included as a constituent of the sensor unit, it is possible to carry out wireless communication with the outside. Consequently, for example, by arranging the sensor unit of the present invention inside a door handle of a vehicle, it is possible to detect an approach of a user's finger.

Further, it is possible to employ this sensor unit as a component part in a key-less entry system of a vehicle, which carries out authorized-user certification utilizing wireless communication.

From a third viewpoint, the present invention discloses a control system, characterized by including: the sensor unit of the present invention; and a control apparatus carrying out certification of an authorized user by utilizing the antenna of aforesaid sensor unit in case in which a report of an approach of a detection object is received from the capacitance type detection device of aforesaid sensor unit, wherein aforesaid control apparatus executes a predetermined control in case of succeeding in aforesaid certification.

In this control system, in a case in which a report of an approach of the detection object is received from the capacitance type detection device of the present invention mentioned above, which is a component part of the sensor unit of the present invention, the control apparatus carries out the certification of the authorized user by means of wireless communication utilizing the antenna of aforesaid sensor unit. Then, with a success in aforesaid certification, the control apparatus executes a predetermined control, for example, locking control or unlocking control in a case in which the control system is a key-less entry system of a vehicle.

Therefore, according to the control system of the present invention, it is possible to prevent execution of a control operation caused by erroneous detection of an approach of a detection object.

From a fourth viewpoint, the present invention discloses a method for detecting an approach of an object, which is used in a capacitance type detection device provided with a sensor electrode forming a capacitor in cooperation with a peripheral conductor, characterized by including: a measurement process measuring the floating capacitance of said sensor electrode which changes correspondingly to a positional relation between said sensor electrode and an electroconductive detection object; and a judgment process judging an approach of aforesaid detection object in a case in which there is satisfied an approach detection condition including a fact that a magnitude correlation between a time rate-of-change of the floating capacitance measured in aforesaid measurement process and a predetermined time rate-of-change which is defined correspondingly to a combination of aforesaid detection object and an object to be discriminated so as to be different from aforesaid detection object lies in a predetermined relation.

In this method for detecting the approach of the object, the floating capacitance of the sensor electrode is measured in the measurement process. Based on the floating capacitance measured in the measurement process in this manner, first, in the judgment process, the time rate-of-change of the measured floating capacitance (for example, average time rate-of-change during the time period of a predetermined time length) is calculated. Subsequently, in the judgment process, it is judged whether or not an approach detection condition is satisfied which includes a fact that a magnitude correlation between a predetermined time rate-of-change defined correspondingly to a combination of the detection object and an object other than the detection object and the calculated time rate-of-change lies in a predetermined relation. In a case in which it is judged that this approach detection condition is satisfied, it is judged that the detection object has approached.

Therefore, according to the method for detecting an approach of an object in the present invention, it is possible to detect an approach of a detection object with excellent accuracy by a simple constitution.

Effect of the Invention

As explained above, according to a capacitance type detection device and a method for detecting an approach of an object in the present invention, there is exerted such an effect that an approach of a detection object is detected with excellent accuracy by a simple constitution without being affected by the shapes or constitutions of the housing and the sensor.

Also, it is possible to employ the sensor unit of the present invention on an occasion of construction of a control system which carries out a control operation after carrying out detection of an approach of the detection object and certification of an authorized user by wireless communication.

Also, according to the control system of the present invention, it is possible to exert such an effect that it is possible to prevent execution of a control operation caused by erroneous detection of an approach of the detection object.

BRIEF DESCRIPTION OF DRAWINGS

FIG. 11 is a flowchart for explaining processes of the first and second judgment units in FIG. 6.

MODE FOR CARRYING OUT THE INVENTION

Figure 1:
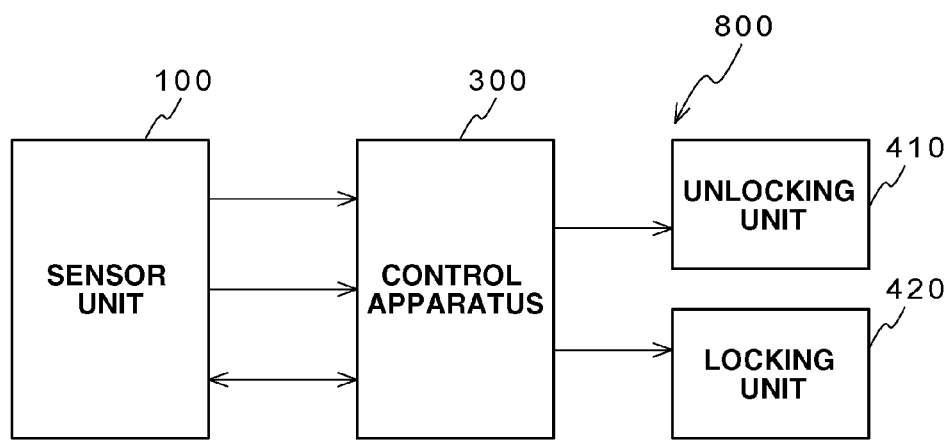
FIG. 1 is a block diagram for explaining a constitution of a key-less entry system which is a control system relating to one exemplified embodiment of the present invention.

Hereinafter, one exemplified embodiment of the present invention will be explained with reference to FIG. 1 to FIG. 11. It should be noted, in the following explanations and drawings, that identical reference numerals are attached to identical or equivalent elements and repetitive explanations thereof will be omitted. It is assumed that the term "object" in the present invention includes human objects and objects other than human objects. The term "approach" in the present invention refers to movement of an object or a target from a state in which it is not close to a sensor or the like to a position in which it is close thereto.

In FIG. 1, there is shown a schematic constitution of a key-less entry system 800 which is a control system relating to one exemplified embodiment. As shown in this FIG. 1, the key-less entry system 800 is provided with a sensor unit 100, a control apparatus 300, an unlocking unit 410 and a locking unit 420.

Figure 2:
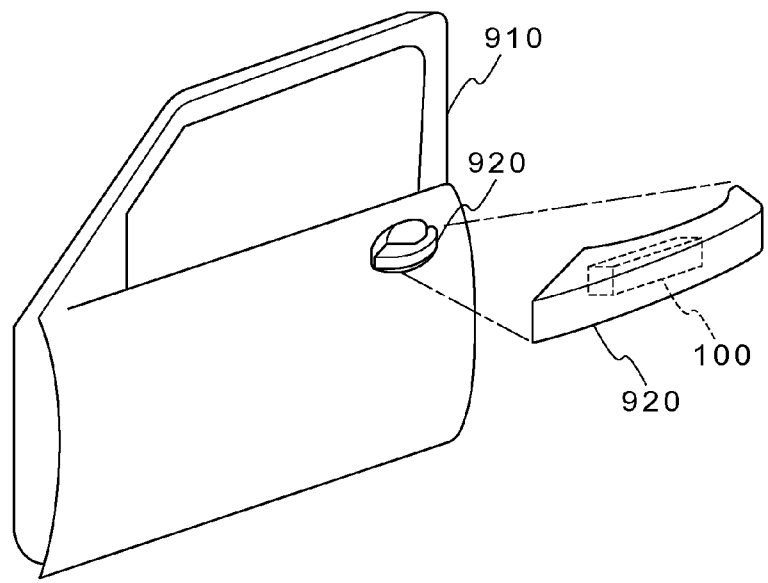
FIG. 2 is a diagram for explaining an arranged position of a sensor unit in FIG. 1.

Here, as shown in FIG. 2, the sensor unit 100 is arranged inside the housing of a door handle 920 at a door 910 of a vehicle. It should be noted in this exemplified embodiment that the sensor unit 100 is arranged inside the door handle 920, but it is also possible for the unit to be exposed on the surface of the door handle 920 on the vehicle body side.

Figure 3:
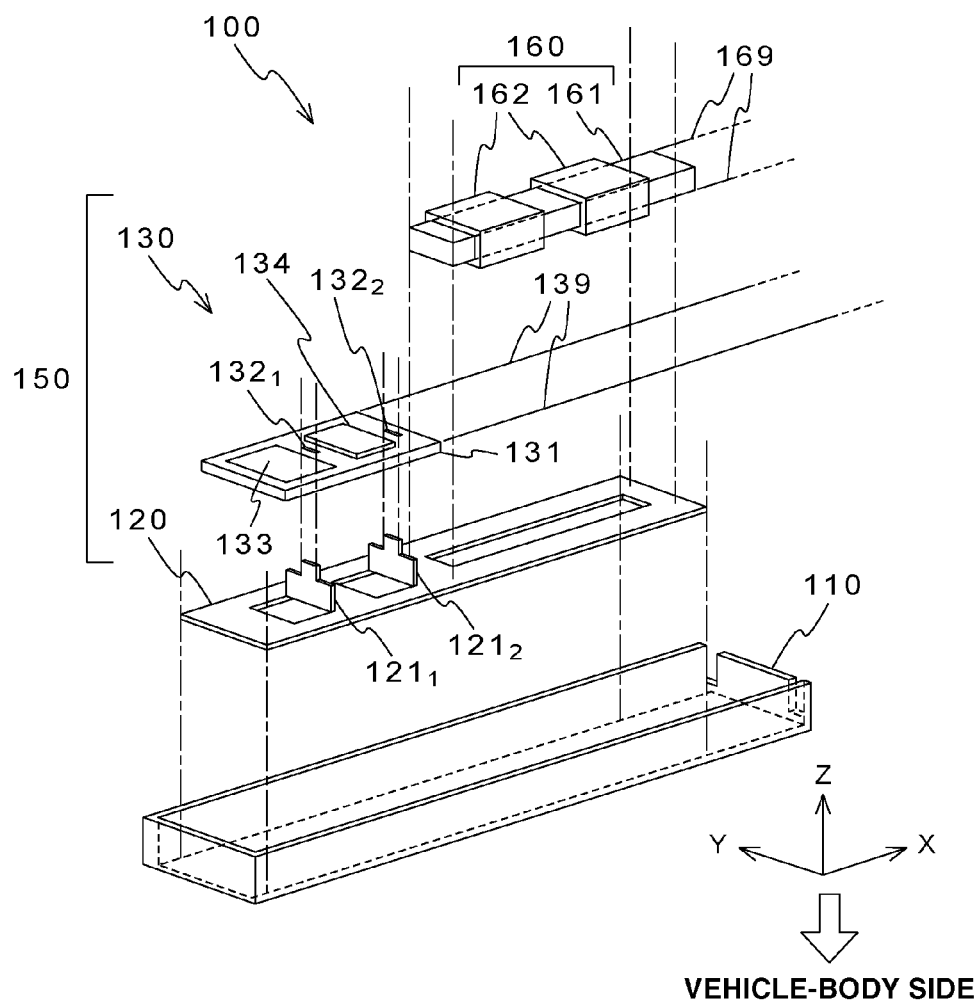
FIG. 3 is an exploded perspective view of a sensor unit for explaining a constitution of the sensor unit in FIG. 1.

As shown in FIG. 3, the sensor unit 100 mentioned above is provided with a case member 110, a capacitance type detection device 150 constituted by a first sensor electrode 120 as a sensor electrode and by a detection unit 130, and an antenna unit 160. Then, it is configured such that the sensor unit 100 is to be manufactured by carrying out sealing shaping with the use of a resin after the first sensor electrode 120, the detection unit 130 and the antenna unit 160 are installed inside the case member 110.

Here, as resins usable for the sealing shaping, it is possible to cite thermoplastic resins such as polyethylen, polyproplylen, polystyrene, styrene-based resin (AS (Acrylonitrile Styrene) resin or ABS (Acrylonitrile Butadiene Styrene) resin), vinyl chloride and the like; or thermosetting resins such as phenol resin, urea resin, melamine resin, epoxy resin and the like; or silicone resins and the like. Any one kind of resin or a mixture of a plurality of resins selected from the group consisting of these insulating resins can be employed as a resin for the sealing shaping.

Also, as sealing methods, it is conceivable, besides injection molding, to employ such a method of filling the case member 110 with the above-mentioned resin which is melting and the like. It should be noted that unless departing from the gist of the present invention, it is possible to employ various kinds of sealing methods.

The case member 110 mentioned above is a box shaped member whose +Z direction side is opened and whose lengthwise direction is the X axis direction, and it is formed after a resin is molded. Here, as material resins for the case member 110, it is possible to cite thermoplastic resins such as polyethylen, polyproplylen, polystyrene, styrene-based resin (AS resin or ABS resin), vinyl chloride and the like; or thermosetting resins such as phenol resin, urea resin, melamine resin, epoxy resin and the like; or silicone resins and the like. Any one kind of resin or a mixture of a plurality of resins selected from the group consisting of these insulating resins can be employed as a resin for member formation. It should be noted that on the inner bottom surface of the case member 110, there are formed a plurality of first protrusion stands for installation of the first sensor electrode 120, and also a claw portion and a second protrusion stand (both of which are not shown) for installing the antenna unit 160.

The first sensor electrode 120 mentioned above is a sensor electrode utilized on an occasion of unlocking control and is fixed to the case member 110 by being welded to the first protrusion stands formed on the inner surface of the case member 110. At an −X direction side portion in this first sensor electrode 120, there is arranged a convex-shape bend protrusion portion $121_1$, $121_2$ for installing the detection unit 130. Here, the bend protrusion portion $121_1$, $121_2$ is formed by bending a portion of the first sensor electrode 120 into an L-shape toward the +Z direction side.

The detection unit 130 mentioned above is provided with a printed circuit board 131. This printed circuit board 131 is formed with a slit shaped opening $132_1$, $132_2$ extending in the Y axis direction so as to allow an upward (+Z direction side) distal portion of the bend protrusion portion $121_1$, $121_2$ to pass through. Here, the length of the slit shaped opening $132_1$, $132_2$ in the Y axis direction is made equal to or greater than the length of the upward distal portion of the bend protrusion portion $121_1$, $121_2$ in the Y axis direction and concurrently, made shorter than the length of a downward (−Z direction side) shoulder portion of the bend protrusion portion $121_1$, $121_2$ in the Y axis direction. Consequently, by placing the printed circuit board 131 over the upside of the first sensor electrode 120 such that the upward distal portion of the bend protrusion portion $121_1$, $121_2$ passes through the slit shaped opening $132_1$, $132_2$, it is possible to separate the first sensor electrode 120 and the printed circuit board 131 from each other. Consequently, deviation of the detection sensitivity of the floating capacitance of the first sensor electrode 120 is suppressed and a change in capacitance can be detected stably.

It should be noted that by soldering a wiring pattern formed on the +Z direction side surface of the printed circuit board 131 to the bend protrusion portion $121_1$, $121_2$ in a state in which the upward distal portion of the bend protrusion portion $121_1$, $121_2$ passes through the slit shaped opening $132_1$, $132_2$, the printed circuit board 131 is fixed with respect to the first sensor electrode 120.

Also, at the −X direction side portion on the +Z direction side surface of the printed circuit board 131, a second sensor electrode 133 as a sensor electrode is formed as a rectangular pattern. This second sensor electrode 133 is a sensor electrode utilized on an occasion of locking control.

Also, at a +X direction side portion on the +Z direction side surface of the printed circuit board 131, there is mounted a detection unit 134. This detection unit 134 is constituted by an LSI (Large Scale Integrated circuit) element and a discrete element such as a resistor. This detection unit 134 is connected with a wiring member 139 having a multi-wire constitution which is utilized for operating power supply or signal transmission to the control apparatus 300. The functional constitution of such a detection unit 134 will be mentioned later.

Figure 4:
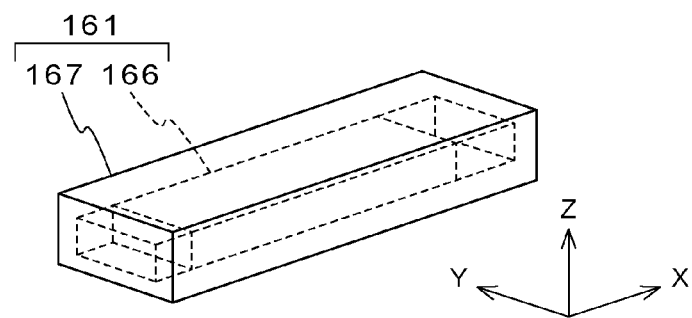
FIG. 4 is a perspective view of a rectangular-object shaped core member for explaining a constitution of an antenna unit in FIG. 3.

The antenna unit 160 mentioned above is provided with a rectangular-object shaped core member 161 and a winding wire portion 162. Here, the rectangular-object shaped core member 161 is, as shown in FIG. 4, provided with (i) a magnetic core member 166 whose lengthwise direction is the X axis direction and (ii) a base member (bobbin member) 167 which covers the outside of the magnetic core member 166 and which is a tube shaped member whose lengthwise direction is the X axis direction. It should be noted that as the material for the magnetic core member 166 it is possible to employ a ferrite such as Ni—Zn ferrite and Mn—Zn ferrite, a soft magnetic metal such as sendust and amorphous metal, or a mixture of the abovementioned two.

Back to FIG. 3, in the antenna unit 160, the winding wire portion 162 is formed by a configuration in which a conduction wire is wound around the surface of the base member 167. This antenna unit 160 is fixed on the case member 110 by a configuration in which the base member 167 of the rectangular-object shaped core member 161 is engaged with the aforementioned claw portion formed on the inner surface of the case member 110 and concurrently, is welded to the second protrusion stand.

Figure 5:
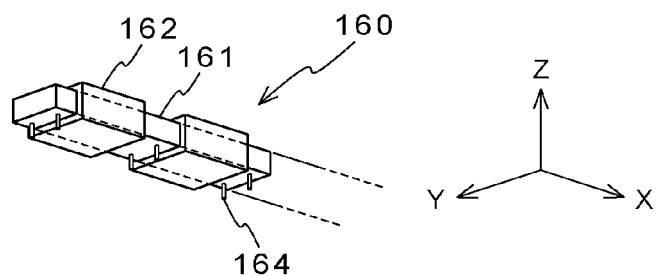
FIG. 5 is a diagram for explaining a constitution on the bottom surface side of the antenna unit in FIG. 3.

It should be noted that on the −Z direction side surface of the rectangular-object shaped core member 161, as shown in FIG. 5, protrusion portions 164 which are higher than the thickness of the winding wire portion 162 are formed at a plurality of positions corresponding to the first sensor electrode 120. For this reason, when the antenna unit 160 is fixed on the case member 110, it is possible to separate them from each other by a constant interval while preventing contact between the first sensor electrode 120 and the winding wire portion 162. Consequently, deviation of the detection sensitivity of the floating capacitance of the first sensor electrode 120 is suppressed and a change in capacitance can be detected stably.

Also, the winding wire portion 162 is connected with a wiring member 169 which is utilized for signal transmission to the control apparatus 300.

Since the sensor unit 100 of this exemplified embodiment is constituted as described above, it is possible, without preparing a spacer member separately, to reliably prevent contact of the first sensor electrode 120 with the printed circuit board 131 of the detection unit 130 and the winding wire portion 162 of the antenna unit 160.

Figure 6:
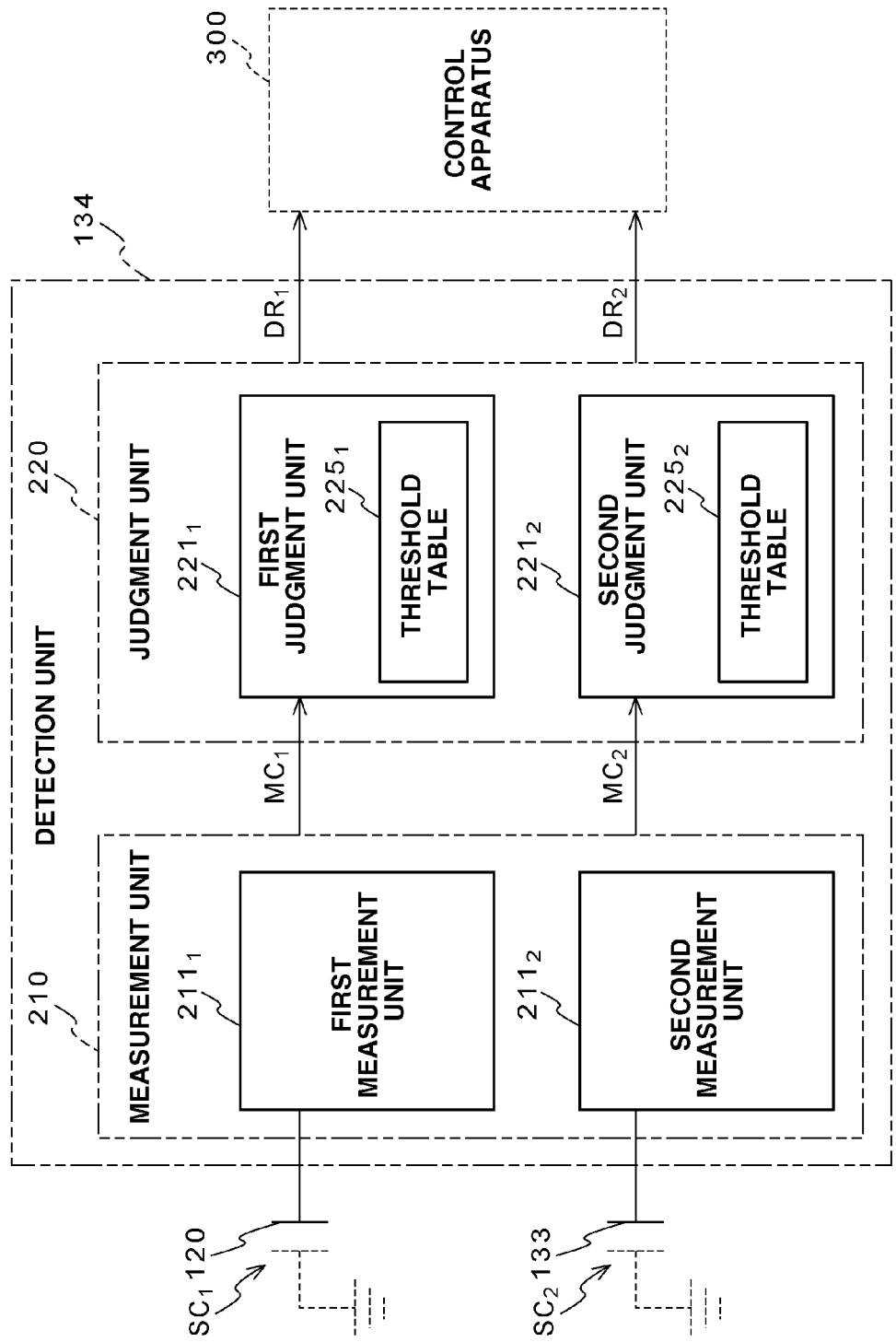
FIG. 6 is a block diagram for explaining a constitution of a detection unit in FIG. 3.

The detection unit 134 mentioned above detects an approach of a finger with respect to the first sensor electrode 120 and an approach of a finger with respect to the second sensor electrode 133 independently. The detection unit 134 having such a function is provided with a measurement unit 210 and a judgment unit 220 as shown in FIG. 6.

The measurement unit 210 mentioned above measures the floating capacitance of the first sensor electrode 120 and the floating capacitance of the second sensor electrode 133. The measurement unit 210 having such a function is provided with a first measurement unit $211_1$ and a second measurement unit $211_2$.

The first measurement unit $211_1$ mentioned above measures a floating capacitance $SC_1$ of the first sensor electrode 120. In this exemplified embodiment, the first measurement unit $211_1$ employs a system in which the floating capacitance of the first sensor electrode 120 is measured by measuring an oscillation frequency utilizing charge/discharge of an integration circuit constituted by the floating capacitance of the first sensor electrode 120 and a resistor element having a predetermined resistance value. However, it is also possible to employ another measurement system such as a bridge circuit system and the like. A measurement capacitance value $MC_1$ which is a measurement result obtained by the first measurement unit $211_1$ is transmitted to the judgment unit 220.

It should be noted that the "predetermined resistance value" is predetermined based on an experiment, simulation, experience or the like from a viewpoint of optimization of the measurement accuracy in consideration of an assumed changeable range of the floating capacitance of the first sensor electrode 120.

The second measurement unit $211_2$ mentioned above measures a floating capacitance SC2 of the second sensor electrode 133. In this exemplified embodiment, the second measurement unit $211_2$ is constituted similarly to the first measurement unit $211_1$ mentioned above and employs a system in which the floating capacitance of the second sensor electrode 133 is measured by measuring an oscillation frequency utilizing charge/discharge of an integration circuit constituted by the floating capacitance of the second sensor electrode 133 and a resistor element having a predetermined resistance value. A measurement capacitance value $MC_2$ which is a measurement result obtained by the second measurement unit $211_2$ is transmitted to the judgment unit 220.

The judgment unit 220 mentioned above judges an approach of a human object (usually, finger) to the first sensor electrode 120 and an approach of a human object (usually, finger) to the second sensor electrode 133. The judgment unit 220 having such a function is provided with a first judgment unit $221_1$ and a second judgment unit $221_2$.

It should be noted in this exemplified embodiment that the first judgment unit $221_1$ and the second judgment unit $221_2$ are configured so as to discriminate between the approach of the human object which is the detection object and the approach of a waterdrop or a water current such as a rain particle or the like to be discriminated from the human object by utilizing the fact that the time rate-of-change of the floating capacitances of the first sensor electrode 120 and the second sensor electrode 133 on an occasion of the approach of the human object is larger than that on an occasion of the approach of the waterdrop or the water current.

The first judgment unit $221_1$ mentioned above is provided with a threshold table $225_1$. Also, the second judgment unit $221_2$ is provided with a threshold table $225_2$.

Figure 7:
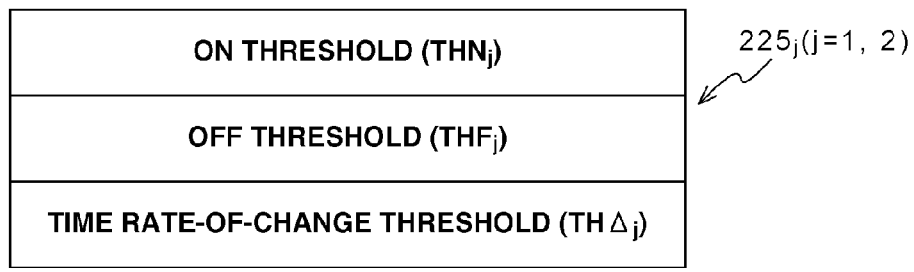
FIG. 7 is a diagram for explaining contents of a threshold table in FIG. 6.
Figure 8:
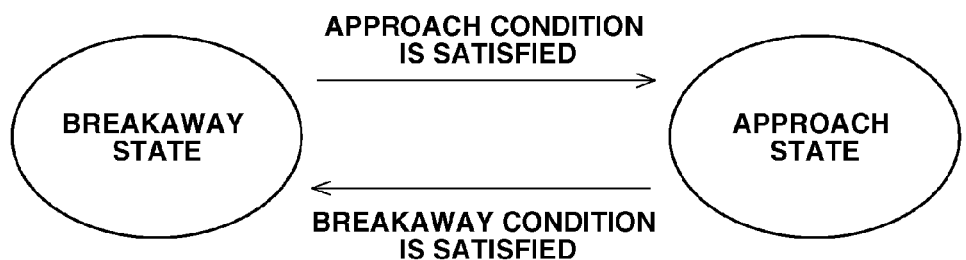
FIG. 8 is a diagram for explaining state transition of first and second judgment units in FIG. 6.

In the threshold table $225_j$ (j=1, 2), as shown in FIG. 7, an ON threshold THNj, an OFF threshold $THF_j$ (<$THN_j$) and a time rate-of-change threshold $THA_j$ (>0) are registered. It is configured such that the internal state of a j-th judgment unit $221_j$, as shown in FIG. 8, changes between a breakaway state and an approach state with reference to these three kinds of thresholds.

In the following explanation, each of the "ON threshold", the "OFF threshold" and the "time rate-of-change threshold" will be also written simply as "threshold".

It should be noted in this exemplified embodiment that the "threshold $THN_j$" and the "threshold $THF_j$" are predetermined in consideration of an assumed changeable range of the floating capacitance of a j-th sensor electrode (120, 133). Also, the "threshold $THA_j$" is predetermined based on an experiment, simulation, experience or the like from a viewpoint of discrimination between the approach of the human object and the approach of the waterdrop or the water current. Here, the "threshold $THN_1$", the "threshold $THF_1$" and the "threshold $THA_1$", and the "threshold $THN_2$", the "threshold $THF_2$" and the "threshold $THA_2$" are values different from each other due to the differences in the electrode area, the area of the human object portion assumed to approach and the like.

The approach condition which is a transition condition from the breakaway state to the approach state in the j-th judgment unit $221_j$ means a condition in which the time rate-of-change of the measurement capacitance value $MC_j$ becomes larger than the threshold $THA_j$ and also the measurement capacitance value $MC_j$ becomes the threshold $THN_j$. Also, the breakaway condition which is a transition condition from the approach state to the breakaway state in the j-th judgment unit $221_j$ means a condition in which the measurement capacitance value $MC_j$ becomes smaller than the threshold THF. For this reason, as shown by a solid line in FIG. 9, when the measurement capacitance value $MC_j$ increases rapidly from a state in which it is smaller than the threshold $THF_j$, namely from a value in the breakaway state, with a time rate-of-change larger than the threshold $THA_j$ and then exceeds the threshold $THN_j$, the internal state of the j-th judgment unit $221_j$ shifts from the breakaway state to the approach state. Also, after the arrival of the approach state, when the measurement capacitance value $MC_j$ falls below the threshold $THF_j$, the state of the j-th judgment unit $221_j$ shifts from the approach state to the breakaway state.

Figure 9:
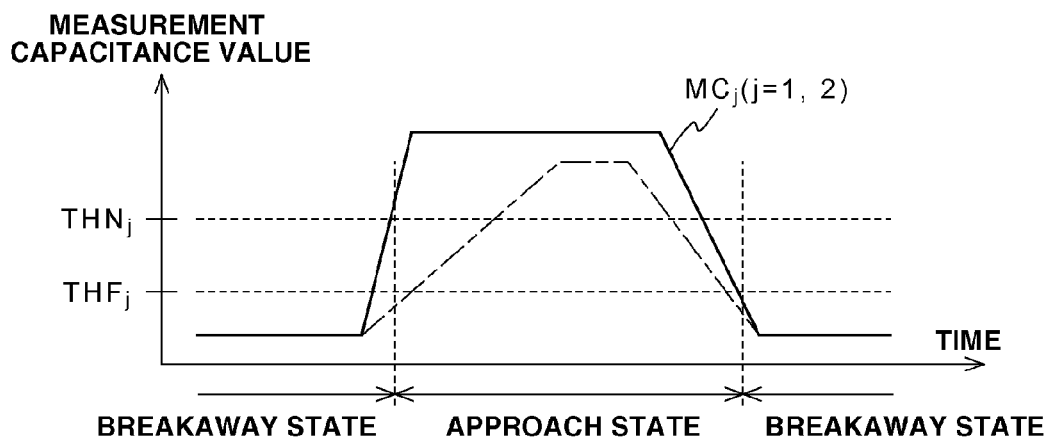
FIG. 9 is a diagram for explaining a relationship between the state transition of the first and second judgment units of FIG. 6 and a threshold.

It should be noted, as shown by a dashed-dotted line in FIG. 9, that in a case in which the measurement capacitance value $MC_j$ gently increases from a value in the breakaway state, which is smaller than the threshold $THF_j$, with a time rate-of-change smaller than the threshold $THA_j$, it happens that the state of the j-th judgment unit $221_j$ does not shift to the approach state and the breakaway state continues, even if the measurement capacitance value $MC_j$ exceeds the threshold $THN_j$.

Back to FIG. 6, the first judgment unit $221_1$ collects, with a period of a predetermined amount of time, the measurement capacitance value $MC_1$ transmitted from the first measurement unit $211_1$. Then, as mentioned above, in a case in which the internal state shifts from the breakaway state to the approach state based on the collection result and three kinds of thresholds registered in the threshold table $225_1$, the first judgment unit $221_1$ judges that the human object has approached and an approach report $DR_1$ is transmitted to the control apparatus 300.

Also, the second judgment unit $221_2$ collects, with a period of a predetermined amount of time, the measurement capacitance value $MC_2$ transmitted from the second measurement unit $211_2$. Then, as mentioned above, in a case in which the internal state shifts from the breakaway state to the approach state based on the collection result and the three kinds of thresholds registered in the threshold table $225_2$, the second judgment unit $221_2$ judges that the human object has approached and an approach report $DR_2$ is transmitted to the control apparatus 300.

Figure 10:
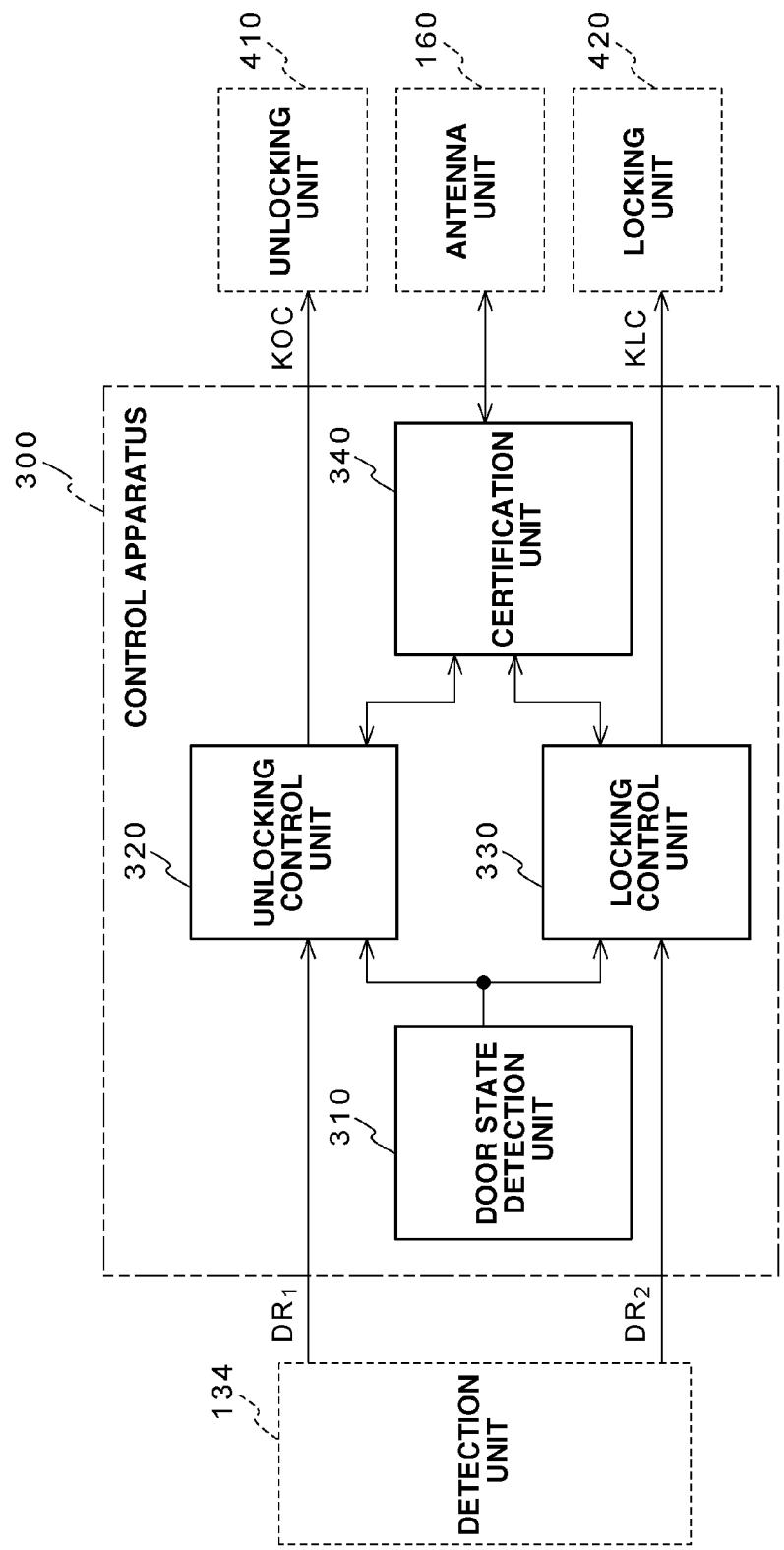
FIG. 10 is a block diagram for explaining a constitution of a control apparatus in FIG. 1.

Back to FIG. 1, the control apparatus 300 mentioned above carries out a certification process of an authorized user by means of communication with an external mobile device such as an IC card or the like in which the antenna unit 160 is utilized. Also, the control apparatus 300 carries out unlocking control and locking control of the door 910 based on a result of aforesaid certification and the approach reports $DR_1$, $DR_2$ transmitted from the detection unit 134. The control apparatus 300 having such a function is, as shown in FIG. 10, provided with a door state detection unit 310, an unlocking control unit 320, a locking control unit 330 and a certification unit 340.

The door state detection unit 310 mentioned above detects an open-close state and a locked state of the door 910. More specifically, the door state detection unit 310 detects which of the following three states the door 910 is in.

(i) Unlocking stand-by state which is a closed state and also is a locked state,
(ii) Locking stand-by state which is a closed state and also is an unlocked state, and
(iii) Open state which is an opened state A door state detection result obtained by the door state detection unit 310 is transmitted to the unlocking control unit 320 and the locking control unit 330.

The unlocking control unit 320 mentioned above receives the approach report $DR_1$ transmitted from the detection unit 134 and a door state detection result transmitted from the door state detection unit 310. Then, in a case in which the door 910 is in the unlocking stand-by state and also the approach report $DR_1$ has been received, the unlocking control unit 320 transmits a certification demand to the certification unit 340. Next, the unlocking control unit 320 receives from the certification unit 340 a certification success report as a response to this certification demand. Finally, the unlocking control unit 320 transmits an unlock instruction KOC to the unlocking unit 410.

The locking control unit 330 mentioned above receives the approach report $DR_2$ transmitted from the detection unit 134 and a door state detection result transmitted from the door state detection unit 310. Then, in a case in which the door 910 is in the locking stand-by state and also the approach report $DR_2$ has been received, the locking control unit 330 transmits a certification demand to the certification unit 340. Next, the locking control unit 330 receives from the certification unit 340 a certification success report as a response to this certification demand. Finally, the locking control unit 330 transmits a lock instruction KLC to the locking unit 420.

The certification unit 340 mentioned above receives a certification demand transmitted from the unlocking control unit 320 or the locking control unit 330. The certification unit 340 which received the certification demand carries out a certification process of the authorized user by carrying out communication with the external mobile device through the antenna unit 160. Then, the certification unit 340 transmits a fact about whether or not it has succeeded in certification as a result of the certification process to the unlocking control unit 320 or to the locking control unit 330, which issued aforesaid certification demand.

Back to FIG. 1, the unlocking unit 410 mentioned above receives the unlock instruction KOC transmitted from the control apparatus 300. The unlocking unit 410 which received this unlock instruction KOC unlocks the door 910.

The locking unit 420 mentioned above receives the lock instruction KLC transmitted from the control apparatus 300. The locking unit 420 which received this lock instruction KLC locks the door 910.

[Operation]

Next, it will be explained with respect to an operation of the key-less entry system 800 constituted as described above.

<Detection Operation of Approach of Human Object to First Sensor Electrode 120>

First, it will be explained with respect to a detection operation of an approach of the human object to the first sensor electrode 120. It should be noted that it is assumed that at first there exists no approach object to the first sensor electrode 120 and the internal state of the first judgment unit 221₁ lies in the breakaway state. Also, it is assumed that the measurement of the floating capacitance of the first sensor electrode 120 by the first measurement unit 211₁ has already started and the periodical collection of the measurement capacitance value $MC_1$ by the first judgment unit 221₁ is being carried out.

On an occasion of detection of an approach of the human object to the first sensor electrode 120, as shown in FIG. 11, first, in step S11, when a predetermined time period ($\Delta T$) elapses from a collection time point of a previous measurement capacitance value $MC_1(T(=T_P))$, the first judgment unit 221₁ collects a new measurement capacitance value $MC_1(T(=T_N=T_P+\Delta T))$. Subsequently, in step S12, the first judgment unit 221₁ judges whether or not the time rate-of-change $FR_M(=(MC_1(T_N)-MC_1(T_P))/\Delta T)$ of the measurement capacitance values $MC_1(T)$ in the time period from the previous collection time point to the collection time point at this time is larger than the threshold $TH\Delta_1$.

In a case in which the result of the judgment in step S12 is negative (step S12: N), the first judgment unit 221₁ judges that the human object is not approaching the first sensor electrode 120. Then, the first judgment unit 221₁ updates the measurement capacitance value $MC_1(T_P)$ to the measurement capacitance value $MC_1(T_N)$ collected this time and thereafter, the process returns to step S11. Then, the processes in step S11, S12 are repeated.

On the other hand, in a case in which the result of the judgment in step S12 is positive (step S12: Y), the process proceeds to step S13. In this step S13, the first judgment unit 221₁ judges whether or not the measurement capacitance value $MC_1(T_N)$ is larger than the threshold $THN_1$.

In a case in which the result of the judgment in step S13 is negative (step S13: N), the first judgment unit 221₁ judges that the human object is not approaching the first sensor electrode 120. Then, the first judgment unit 221₁ updates the measurement capacitance value $MC_1(T_P)$ to the measurement capacitance value $MC_1(T_N)$ collected this time and thereafter, the process returns to step S11. Then, the processes in steps S11 to S13 are repeated.

On the other hand, in a case in which the result of the judgment in step S13 is positive (step S13: Y), it is judged that the human object has approached the first sensor electrode 120 and the process proceeds to step S14. In this step S14, the first judgment unit 221₁ shifts the internal state from the breakaway state to the approach state and concurrently, transmits the approach report $DR_1$ to the control apparatus 300.

Thereafter, the first judgment unit 221₁ updates the measurement capacitance value $MC_1(T_P)$ to the measurement capacitance value $MC_1(T_N)$ collected this time and thereafter, the process proceeds to step S15.

In step S15, when a predetermined time period ($\Delta T$) elapses from the collection time point of a previous measurement capacitance value $MC_1(T_P)$, the first judgment unit 221₁ collects a new measurement capacitance value $MC_1(T_N)$. Subsequently, in step S16, the first judgment unit 221₁ judges whether or not the measurement capacitance value $MC_1(T_N)$ is smaller than the threshold $THF_1$.

In a case in which the result of the judgment in step S16 is negative (step S16: N), the first judgment unit 221₁ judges that the human object is not away from the first sensor electrode 120. Then, the first judgment unit 221₁ updates the measurement capacitance value $MC_1(T_P)$ to the measurement capacitance value $MC_1(T_N)$ collected this time and thereafter, the process returns to step S15. Then, the processes in steps S15, S16 are repeated.

In a case in which the result of the judgment in step S16 is negative (step S16: N), the first judgment unit 221₁ judges that the human object is not away from the first sensor electrode 120. Then, the first judgment unit 221₁ updates the measurement capacitance value $MC_1(T_P)$ to the measurement capacitance value $MC_1(T_N)$ collected this time and thereafter, the process returns to step S15. Then, the processes in steps S15, S16 are repeated.

Thereafter, the processes in steps S11 to S16 are repeated. As a result of this, the approach report $DR_1$ is transmitted from the first judgment unit 221₁ to the control apparatus 300 every time an approach of the human object is detected in a case in which the internal state of the first judgment unit 221₁ lies in the breakaway state.

<Detection Operation of Human Object Approach to Second Sensor Electrode 133>

Next, it will be explained with respect to an operation of detecting an approach of the human object to the second sensor electrode 133. This operation is executed similarly to the above-mentioned operation of detecting an approach of the human object to the first sensor electrode 120 except that the subject matter of the process in FIG. 11 is the second judgment unit 221₂ and that the second judgment unit 221₂ carries out judgment of an approach of the human object based on periodical collection results of the measurement capacitance value $MC_2$ and the thresholds $THN_2$, $THF_2$, $TH\Delta_2$. As a result of this, the approach report $DR_2$ is transmitted from the second judgment unit 221₂ to the control apparatus 300 every time an approach of the human object is detected in a case in which the internal state of the second judgment unit 221₂ lies in the breakaway state.

<Unlocking Control Operation>

Next, it will be explained with respect to an unlocking control operation by the control apparatus 300. Note that, it is assumed that the door state detection unit 310 has already started the detection operation and has been reporting a door state detection result to the unlocking control unit 320 successively.

The unlocking control operation by the control apparatus 300 is executed every time the unlocking control unit 320 receives the approach report $DR_1$ transmitted from the detection unit 134. Upon receipt of the approach report $DR_1$, the unlocking control unit 320 judges whether or not the door 910 is in the unlocking stand-by state with reference to the door state detection result. In a case in which the result of this judgment is negative, the unlocking control unit 320 immediately terminates the unlocking control operation at this time. As a result of this, there continues the door state at the time point when the unlocking control unit 320 received the approach report $DR_1$.

On the other hand, in a case in which the result of the judgment about whether or not the door 910 is in the unlocking stand-by state is positive, the unlocking control unit 320 transmits a certification demand to the certification unit 340. The certification unit 340 which received this certification demand transmits a signal for transmission certification to the outside through the antenna unit 160.

When the signal for transmission certification transmitted to the outside in this manner is received by a mobile device carried by the authorized user (hereinafter, referred to as "authorized mobile device"), the authorized mobile device sends back an authorized signal for reply certification which correctly corresponds to the signal for transmission certification. The certification unit 340 which received this authorized signal for reply certification through the antenna unit 160 carries out verification between the content of the signal for transmission certification and the content of the authorized signal for reply certification and succeeds in certifying the authorized user. Then, the certification unit 340 transmits a certification success report, which is a report to the effect that it succeeded in certifying the authorized user, to the unlocking control unit 320.

Upon receipt of the certification success report, the unlocking control unit 320 transmits the unlock instruction KOC to the unlocking unit 410 and terminates the unlocking control operation at this time. As a result of this, the unlocking unit 410 which received the unlock instruction KOC unlocks the door 910.

On the other hand, in a case in which a mobile device other than the authorized mobile device receives the signal for transmission certification, aforesaid mobile device sends back a signal for reply certification other than the authorized signal for reply certification. In this case, the certification unit 340 which received it through the antenna unit 160 carries out verification between the content of the signal for transmission certification and the content of the signal for reply certification and fails to certify the authorized user.

Also, in a case in which the mobile device does not exist within the access range of the signal for transmission certification regardless of whether or not it is the authorized mobile device, it is not possible for the certification unit 340 to receive any kind of signal for reply certification. In this case also, the certification unit 340 fails to certify the authorized user.

In a case in which it failed to certify the authorized user, the certification unit 340 transmits a certification failure report, which is a report to the effect that it failed to certify the authorized user, to the unlocking control unit 320. Upon receipt of the certification failure report, the unlocking control unit 320 terminates the unlocking control operation at this time without transmitting the unlock instruction KOC to the unlocking unit 410. As a result of this, there continues the door state at the time point when the unlocking control unit 320 received the approach report $DR_1$.

<Locking Control Operation>

Next, it will be explained with respect to a locking control operation by the control apparatus 300. Note that, it is assumed that the door state detection unit 310 has already started the detection operation and has been reporting the door state detection result to the locking control unit 330 successively.

The locking control operation by the control apparatus 300 is executed every time the locking control unit 330 receives the approach report $DR_2$ transmitted from the detection unit 134. Upon receipt of the approach report $DR_2$, the locking control unit 330 judges whether or not the door 910 is in the locking stand-by state with reference to the door state detection result. In a case in which the result of this judgment is negative, the locking control unit 330 immediately terminates the locking control operation at this time. As a result of this, there continues the door state at the time point when the locking control unit 330 received the approach report $DR_2$.

On the other hand, in a case in which the result of the judgment about whether or not the door 910 is in the locking stand-by state is positive, the locking control unit 330 transmits a certification demand to the certification unit 340. The certification unit 340 which received this certification demand carries out a process similar to that in case of the unlocking control operation mentioned above and transmits a certification success report or a certification failure report to the locking control unit 330.

Upon receipt of the certification success report, the locking control unit 330 transmits the lock instruction KLC to the locking unit 420 and terminates the locking control operation at this time. As a result of this, the locking unit 420 which received the lock instruction KLC locks the door 910.

On the other hand, upon receipt of the certification failure report, the locking control unit 330 terminates the locking control operation at this time without transmitting the lock instruction KLC to the locking unit 420. As a result of this, there continues the door state at the time point when the locking control unit 330 received the approach report $DR_2$.

As explained above, in this exemplified embodiment, discrimination between an approach of a human object to the sensor electrode and an approach of a waterdrop or a water current is performed by judging whether or not the time rate-of-changes of the floating capacitances of the sensor electrodes 120, 134 are larger than the thresholds $TH\Delta_1$, $TH\Delta_2$. Therefore, according to this exemplified embodiment, it is possible to detect an approach of a human object to the sensor electrode with excellent accuracy without confusing the approach of the human object and an approach of a waterdrop or a water current.

Also, in this exemplified embodiment, it is detected with excellent accuracy that a human object has approached the sensor electrode and based on the detection result thereof, unlocking control and locking control of the door is carried out. For this reason, it is possible to prevent a malfunction relating to the unlocking control and the locking control of the door caused by an approach of a waterdrop or a water current.

Modification of Exemplified Embodiment

The present invention is not limited by the exemplified embodiments described above and it is possible to employ various kinds of modifications.

For example, in the exemplified embodiment described above, in order to discriminate between the approach of the human object to the sensor electrode and the approach of the water drop or the water current, there was employed a configuration in which the approach of the human object to the sensor electrode is to be detected by applying a condition that the time rate-of-change of the floating capacitance of the sensor electrode is larger than the time rate-of-change threshold registered beforehand as one of necessary conditions.

On the other hand, it is also allowed to employ a configuration in which the approach of the detection object to the sensor electrode is to be detected by applying a condition, as one of the necessary conditions, that the time rate-of-change of the floating capacitance of the sensor electrode is smaller than the time rate-of-change threshold registered beforehand, depending on the relation of physical properties between a detection object and an object to be discriminated from aforesaid detection object.

Further, in a case in which there exist two or more kinds of detection objects and it is not possible to discriminate between an approach of the detection objects and an approach of an object to be discriminated from aforesaid detection objects (object other than detection objects) based on a comparison between a single kind of time rate-of-change threshold and a measurement capacitance value, it is allowed to detect the approach of the detection objects to the sensor electrode as follows. More specifically, an upper limit time rate-of-change threshold and a lower limit time rate-of-change threshold are registered beforehand and by applying a condition that the time rate-of-change of the floating capacitance of the sensor electrode lies between the upper limit time rate-of-change threshold and the lower limit time rate-of-change threshold as one of necessary conditions, the approach of the detection objects to the sensor electrode is to be detected.

Also, in the exemplified embodiment described above, it was configured so as to predetermine the "ON threshold" and the "OFF threshold" in consideration of an assumed changeable range of the floating capacitance of the sensor electrode, but it is allowed conversely to determine the "ON threshold" and the "OFF threshold" based on the measurement values of the floating capacitance of the sensor electrode. For example, it is possible to determine the "ON threshold" and the "OFF threshold" by multiplying the movement average value of the measurement values of the floating capacitance of the sensor electrode by a value of one or more which can be predetermined.

In the exemplified embodiment described above, the control system of the present invention was applied to a key-less entry system of a vehicle, but it is possible to apply the control system of the present invention also to a trunk open system of a vehicle and a key-less entry system relating to a door of a building.

Also, in the exemplified embodiment described above, the capacitance type detection device of the present invention was applied to a capacitance type detection device in a key-less entry system of a vehicle, but it is possible to apply the capacitance type detection device of the present invention to various kinds of touch sensors.

INDUSTRIAL APPLICABILITY

As explained above, it is possible for the capacitance type detection device of the present invention to be applied to a capacitance type detection device in which it is necessary to prevent confusion between an approach of a detection object and an approach of an object other than the detection object.

Also, it is possible for the sensor unit of the present invention to be applied to a sensor unit which is used on an occasion of construction of a control system for carrying out a control operation after carrying out detection of an approach of a detection object and certification of an authorized user by wireless communication.

Also, it is possible for the control system of the present invention to be applied to a control system in which a control operation is carried out after carrying out detection of an approach of a detection object and certification of an authorized user by wireless communication.

The invention claimed is:

1. A capacitance type detection device which detects an approach of an electroconductive detection object comprising:
   a sensor electrode forming a capacitor with respect to a peripheral conductor;
   a measurement unit measuring a floating capacitance, which changes correspondingly to a positional relation between said sensor electrode and said detection object, of said sensor electrode; and
   a judgment unit configured to judge whether a magnitude correlation between a rate of change of the floating capacitance measured by said measurement unit and a predetermined rate of change of the floating capacitance, which is defined correspondingly to a combination of said detection object and another object to be discriminated from said detection object, satisfies a predetermined relation,
   wherein
   a threshold table, in which the predetermined rate of change of the floating capacitance is registered, is used in the judgment unit.

2. The capacitance type detection device according to claim 1, characterized in that said approach detection condition further includes a condition that said measured floating capacitance exceeds a predetermined value defined correspondingly to said detection object.

3. A sensor unit, characterized by comprising:
   the capacitance type detection device according to claim 1; and
   an antenna carrying out transmission and reception of a radio signal.

4. The sensor unit according to claim 3, characterized by being arranged inside a door handle of a vehicle.

5. A control system, characterized by comprising:
   the sensor unit according to claim 3; and
   a control apparatus carrying out certification of an authorized user by utilizing the antenna of said sensor unit in case of receiving a report of the approach of the detection object from the capacitance type detection device of said sensor unit, wherein
   said control apparatus executes a predetermined control in case of succeeding in said certification.

6. A method for detecting an approach of an object, which is used in a capacitance type detection device provided with a sensor electrode forming a capacitor in cooperation with a peripheral conductor, by the method comprising:
   measuring a floating capacitance of said sensor electrode which changes correspondingly to a positional relation between said sensor electrode and an electroconductive detection object; and
   a judging whether a magnitude correlation between a rate of change of the floating capacitance measured in step of measuring and a predetermined rate of change of the floating capacitance, which is defined correspondingly to a combination of said detection object and another object to be discriminated from said detection object satisfies a predetermined relation,
   wherein
   a threshold table, in which the predetermined rate of change of the floating capacitance is registered, is used in the step of judging.

* * * * *